United States Patent
Chen

(10) Patent No.: US 7,282,998 B2
(45) Date of Patent: Oct. 16, 2007

(54) METHOD AND APPARATUS FOR CALIBRATING CENTER FREQUENCY OF POWER AMPLIFIER

(75) Inventor: Tzung-Ming Chen, Taipei (TW)

(73) Assignee: Realtek Semiconductor Corp., HsinChu (TW)

( * ) Notice: Subject to any disclaimer, the term of this patent is extended or adjusted under 35 U.S.C. 154(b) by 148 days.

(21) Appl. No.: 11/160,734

(22) Filed: Jul. 6, 2005

(65) Prior Publication Data

US 2006/0028268 A1 Feb. 9, 2006

(30) Foreign Application Priority Data

Aug. 3, 2004 (TW) .............................. 93123272 A

(51) Int. Cl.
*H03F 3/191* (2006.01)

(52) U.S. Cl. ..................................... 330/305
(58) Field of Classification Search ................ 330/305, 330/279
See application file for complete search history.

(56) References Cited

U.S. PATENT DOCUMENTS 6,424,209 B1 * 7/2002 Gorecki et al. ................. 330/9
6,653,904 B2 * 11/2003 Franca-Neto ............... 330/302

* cited by examiner

*Primary Examiner*—Robert Pascal
*Assistant Examiner*—Alan Wong
(74) *Attorney, Agent, or Firm*—Winston Hsu

(57) ABSTRACT

A method and an apparatus for calibrating the center frequency of a power amplifier. The apparatus includes a capacitor unit and an inductor unit. The capacitor unit and the inductor unit are connected in parallel so as to control the center frequency of the power amplifier. The method includes: (a) controlling the capacitor unit to correspond with a plurality of test capacitance values; (b) inputting an input signal with the center frequency to the power amplifier, and recording a plurality of test output powers generated according to the test capacitance values and the input signal; and (c) selecting one predetermined power among the test output powers, and utilizing a test capacitance value corresponding to the predetermined power to set a capacitance value of the capacitor unit.

26 Claims, 6 Drawing Sheets

METHOD AND APPARATUS FOR CALIBRATING CENTER FREQUENCY OF POWER AMPLIFIER

BACKGROUND OF THE INVENTION

1. Field of the Invention

The present invention relates to a power amplifier, and more specifically, to an apparatus and method for calibrating the center frequency of a power amplifier.

2. Description of the Prior Art

For modern integrated circuits (ICs), power amplifiers are applied extensively in wired and wireless communication devices. Please refer to FIG. 1 in conjunction with FIG. 2. FIG. 1 is a circuit diagram of a conventional power amplifier 100. FIG. 2 is a frequency response diagram of the power amplifier 100 shown in FIG. 1. The power amplifier 100 includes a loading circuit 120 and an amplifying circuit 140 for generating an output signal Vout based on an input signal Vin. According to the frequency response of the power amplifier 100, the gain of the power amplifier 100 is controlled by its center frequency, usually determined according to capacitance and inductance of the loading circuit 120. As shown in FIG. 1, the loading circuit 120 comprises a capacitor 122 (the capacitance is $C_0$) and an inductor 124 (the inductance is $L_0$) connected in parallel with the capacitor 122. The capacitance $C_0$ and the inductance $L_0$ both determine the center frequency Fc of the frequency response shown in FIG. 2. The equation showing this relationship is:

$$Fc = \frac{1}{2\pi\sqrt{L_0 \times C_0}} \quad \text{eq. (1)}$$

It is known that unexpected factors in the manufacturing process can cause the capacitance $C_0$ of the capacitor 122 and the inductance $L_0$ of the inductor 124 in the loading circuit 120 to stray from desired values, therefore the center frequency Fc can also stray from a predetermined frequency, as can be observed from eq.(1). Moreover, other factors, such as operating temperature of the power amplifier 100, result in a shift of the center frequency Fc. Please refer to FIG. 2. Assuming the ideal center frequency of the power amplifier 100 is Fc and given an input signal Vin with frequency Fc, the power amplifier 100 amplifies the input signal Vin to generate an output signal Vout corresponding to a gain A at frequency Fc. However, if component characteristics in the loading circuit 120 have some alterations, the center frequency will shift from Fc to Fc'. In this condition, given an input signal Vin with frequency Fc, the power amplifier will amplify the input signal Vin to generate another output signal Vout corresponding to another gain A' at frequency Fc. Obviously, as the gain A' is smaller than the gain A and the center frequency of the power amplifier 100 strays, the output power is decreased. As a result, not only is the transmission quality decreased but the transmission distance is shortened; seriously affecting the signal transmission.

SUMMARY OF THE INVENTION

It is therefore one of the objectives of the claimed invention to provide a method and apparatus for calibrating the center frequency of a power amplifier by adjusting capacitance and inductance, to solve the above problem.

According to an embodiment of the claimed invention, a power amplifier is disclosed. The power amplifier includes a power-amplifying module for receiving an input signal and amplifying power of the input signal to generate an output signal, a logic control unit for generating a control signal to set a center frequency of the power-amplifying module, and an output-signal-detecting unit for detecting and recording corresponding characteristic values of the output signals for the condition where the control signals have a plurality of different values.

According to an embodiment of the claimed invention, a method for calibrating a power amplifier is disclosed. The method includes generating a control signal to set a center frequency of the power amplifier, detecting a characteristic value of the output signal of the power amplifier, recording the detected characteristic values of the output signal for the condition where the control signals have a plurality of different values, and choosing a predetermined control signal value according to the recorded characteristic value.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
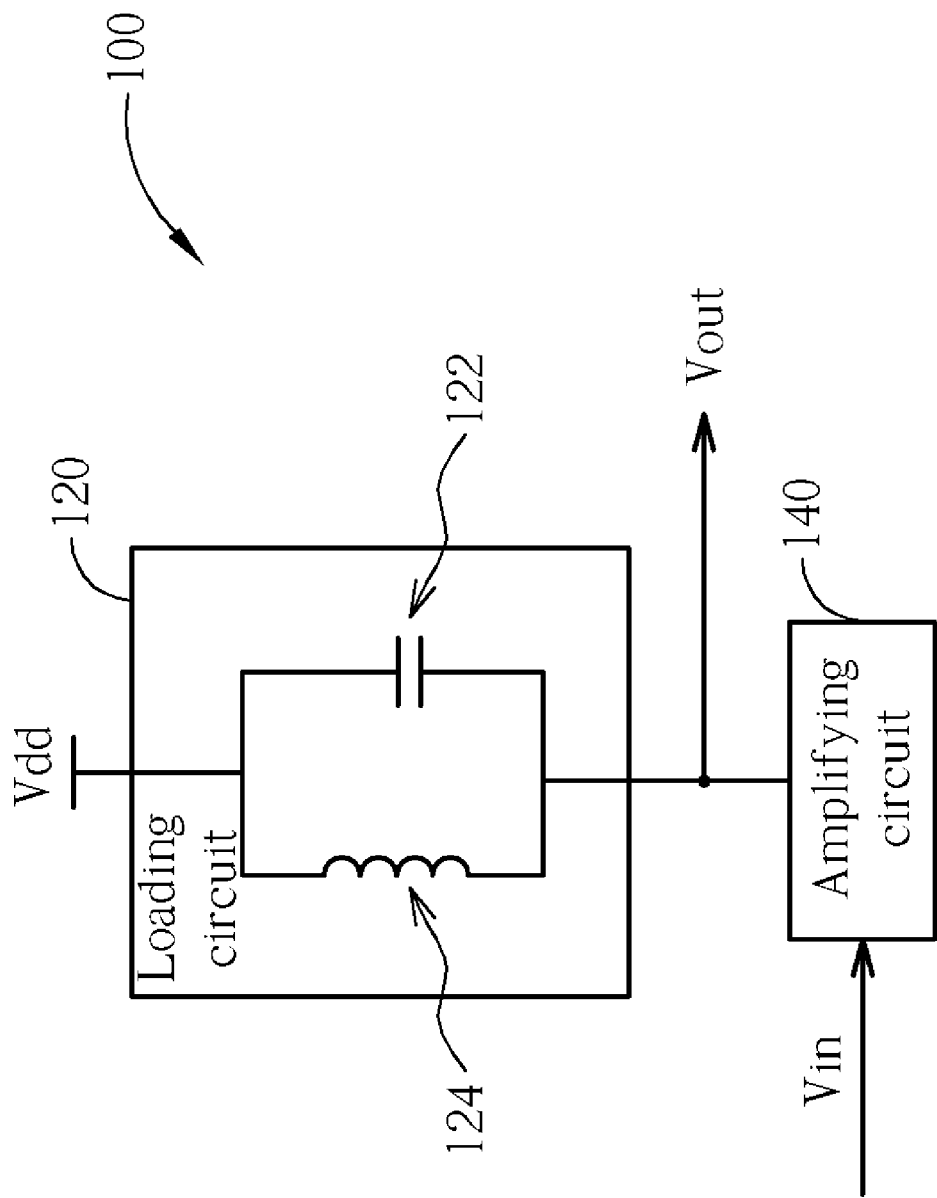
FIG. 1 is a circuit diagram of a power amplifier according to the prior art.
Figure 2:
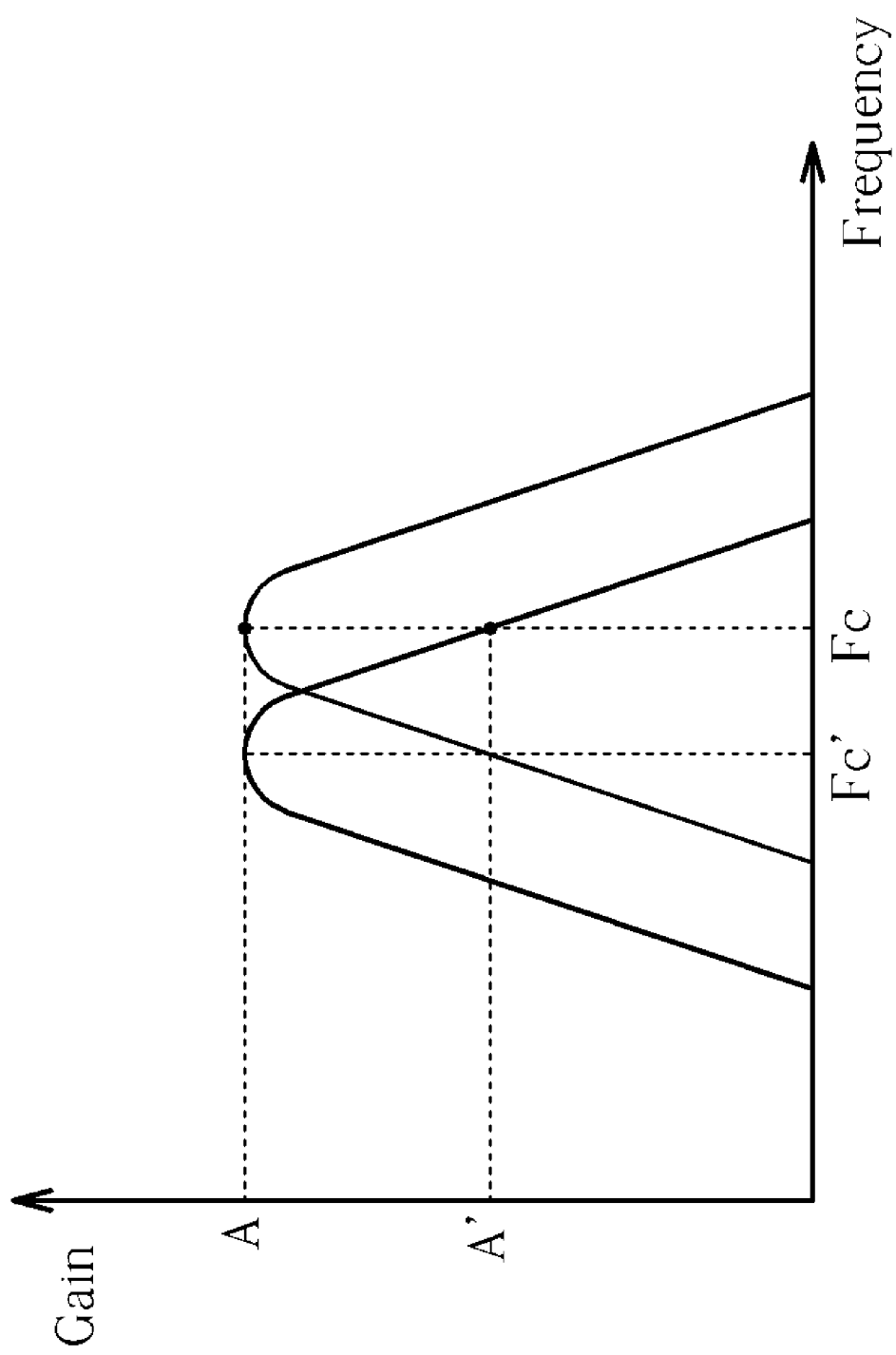
FIG. 2 is a frequency response diagram of the power amplifier shown in FIG. 1.
Figure 3:
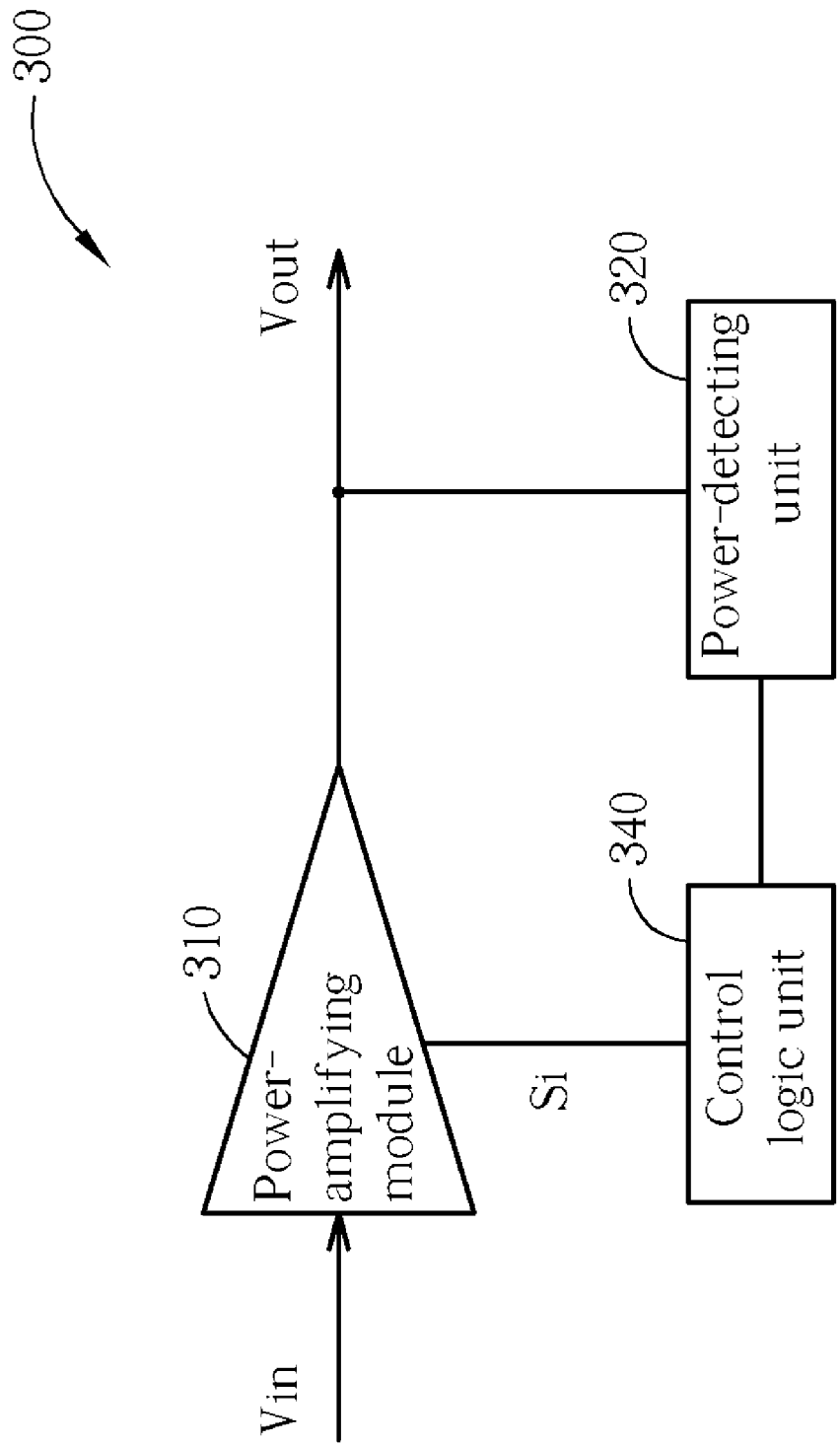
FIG. 3 is a diagram of an embodiment of the power amplifier claimed in the invention.
Figure 4:
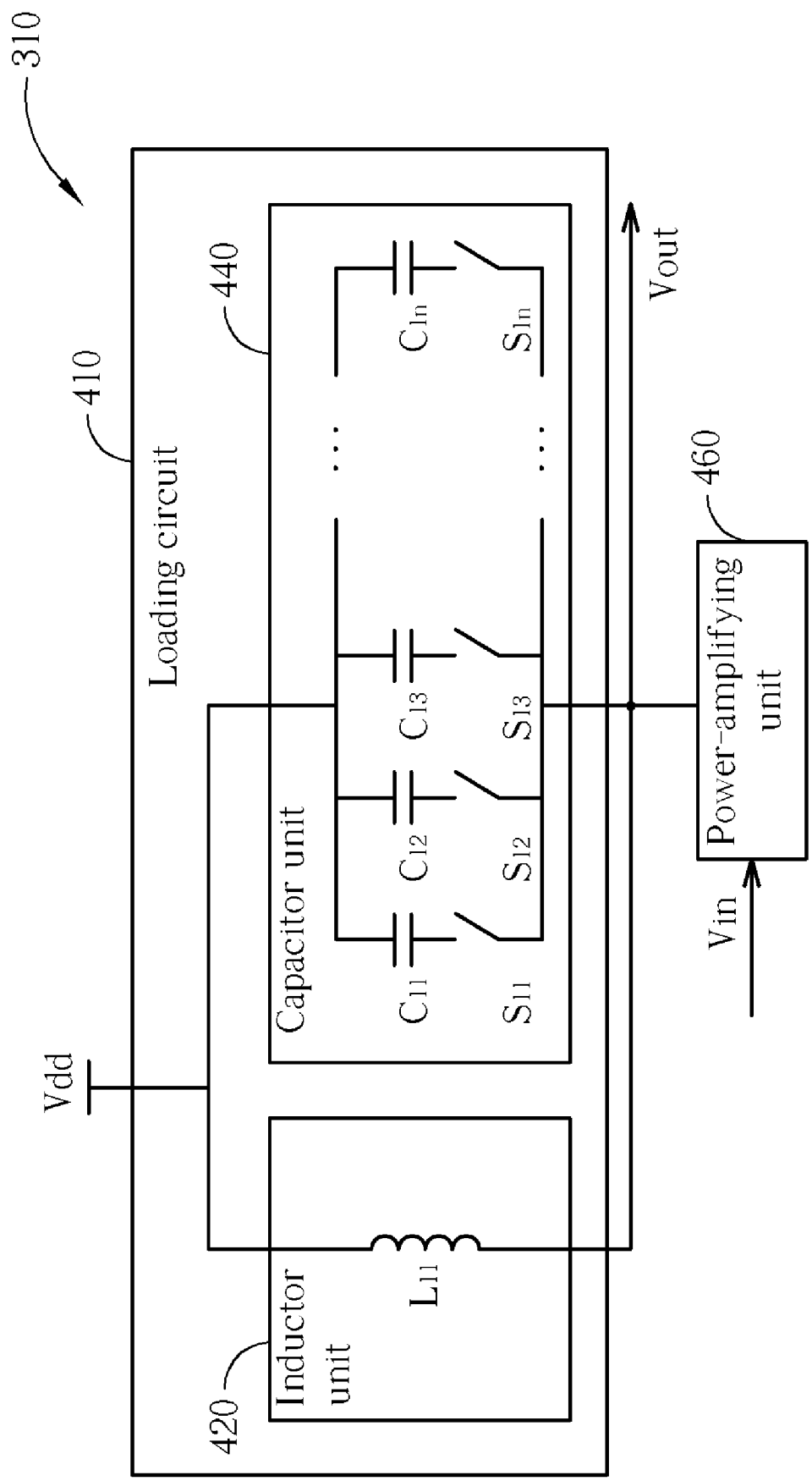
FIG. 4 is a detailed circuit diagram of an embodiment of the power-amplifying module shown in FIG. 3.

Please refer to FIG. 3 in conjunction with FIG. 4. FIG. 3 is a diagram of a power amplifier 300 according to an embodiment of the present invention, and FIG. 4 is a detailed circuit diagram of an embodiment of the power-amplifying module 310 shown in FIG. 3. As FIG. 3 shows, the power amplifier 300 includes a power-amplifying module 310, a power-detecting unit 320, and a control logic unit 340. The power-amplifying module 310 amplifies an input signal Vin to generate an output signal Vout, and the power-detecting unit 320 detects the value of output signal Vout. The control logic unit 340 outputs a plurality of control signals Si into the power-amplifying module 310 to adjust element characteristic values during the calibrating process, and compares a plurality of power values corresponding to output signals Vout in the calibrating process to determine optimal element characteristic values of the power-amplifying module 310. The calibrating steps of the power-amplifying module 310 are described as follows.

As shown in FIG. 4, the power-amplifying module 310 includes a loading circuit 410 and a power-amplifying unit 460, the loading circuit 410 having an inductor unit 420 and a capacitor unit 440. In this embodiment, the inductor unit 420 includes an inductor $L_{11}$, the capacitor unit 440 includes n switches $S_{11}, S_{12}, \ldots, S_{1n}$ corresponding to n capacitors $C_{11}$, $C_{12}$, ..., $C_{1n}$ respectively, and the power-amplifying unit 460 is applied to amplify the input signal Vin for generating the output signal Vout. The control signal Si outputted from the control logic unit 340 shown in FIG. 3 controls on/off states of switches $S_{11}$, $S_{12}$, ..., $S_{1n}$ corresponding to capacitors $C_{11}$, $C_{12}$, ..., $C_{1n}$ in the capacitor unit 440. In other words, the state of the switches (open or closed) influences the parallel relationship of capacitors $C_{11}$, $C_{12}$, ..., $C_{1n}$, and furthermore, changes the capacitance of the capacitor unit 440. It is known from eq.(1) described above, that the center frequency Fc relates to the capacitance of the capacitor unit 440, therefore, this embodiment adjusts capacitance of the capacitor unit 440 in order to properly set a desired value to the center frequency of the power-amplifying module 310.

Figure 5:
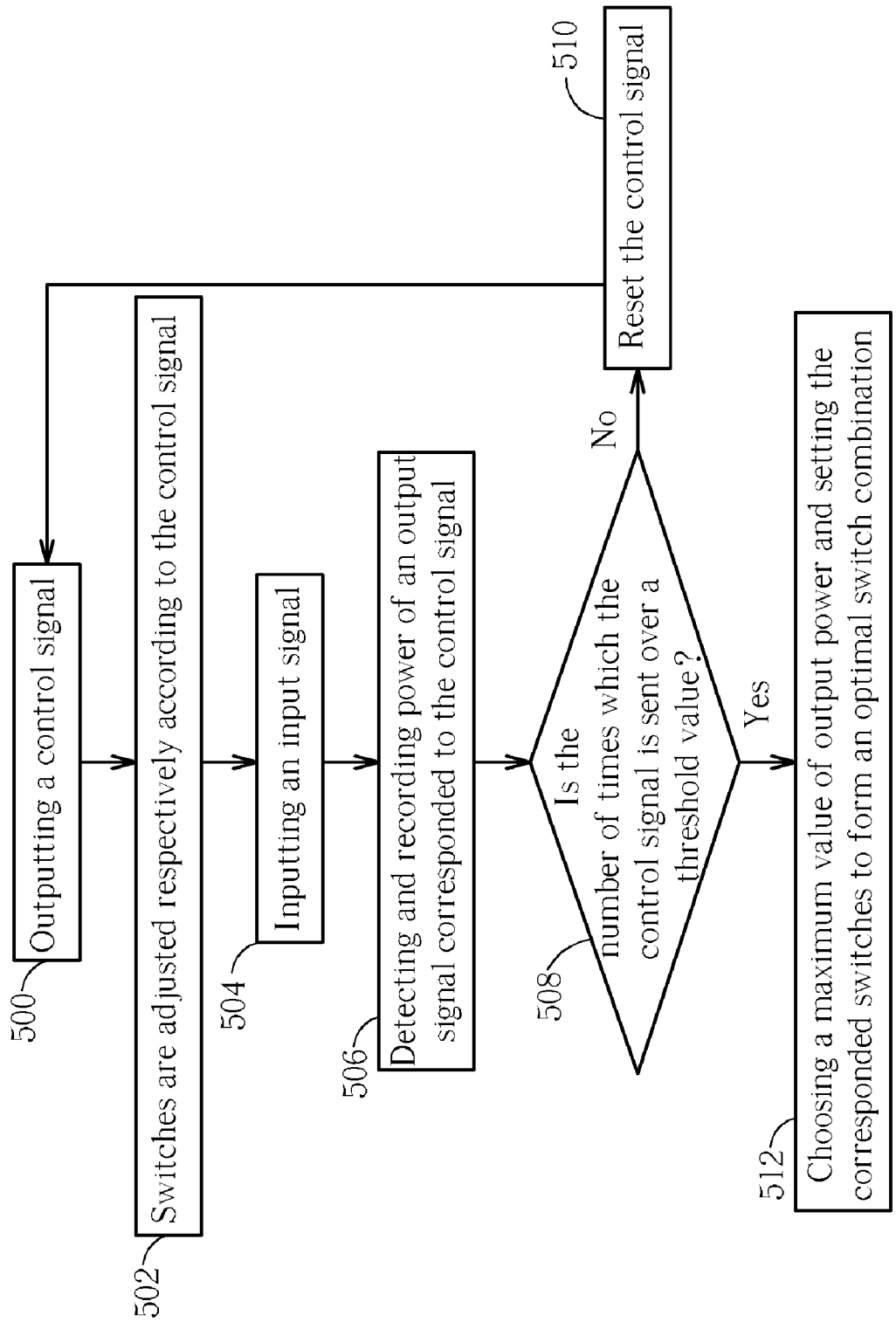
FIG. 5 is a flowchart illustrating a method of the power amplifier shown in FIG. 3 for calibrating the center frequency of the power-amplifying module.

Please refer to FIG. 5. FIG. 5 is a flowchart illustrating a method of calibrating the center frequency of the power-amplifying module 310 shown in FIG. 3. The method for calibrating the center frequency of the power-amplifying module 310 in the embodiment includes the following steps:

Step 500: The control logic unit 340 outputs the control signal Si into the capacitor unit 440;

Step 502: Switches $S_{11}$, $S_{12}$, ..., $S_{1n}$ in the capacitor unit 440 are adjusted according to the control signal Si;

Step 504: An input signal Vin corresponding to a predetermined center frequency Fc is inputted into the power amplifier 300;

Step 506: The power detecting unit 320 detects and records power of an output signal Vout corresponding to the control signal Si Step 508: The control logic unit 340 checks how many times the control signal Si has been sent—if the number of times which the control signal Si has been sent is over a threshold value, the flow proceeds to step 512; otherwise, go to step 510;

Step 510: The control logic unit 340 resets the control signal Si. Go back to step 500;

Step 512: The control logic unit 340 compares recorded power values and corresponding control signals Si associated with a plurality of output signals Vout, and chooses a control signal Si corresponding to a maximum output power to control switches $S_{11}$, $S_{12}$, ..., $S_{1n}$, to form an optimal switch combination (i.e., an optimal connecting topology).

The method for calibrating the center frequency of power-amplifying module 310 is detailed below. At first, the control logic unit 340 outputs a control signal Si with n control bits, for example:

$$Si=[S11, S12, S13, \ldots, S1n]=[100 \ldots 0] \quad \text{eq.(2)}$$

Each control bit S11-S1n in eq.(2) controls corresponding switches $S_{11}$-$S_{1n}$; that is to say, if the logic state of a control bit is "0", then the switch corresponding to that control bit is turned off; on the other hand, if the logic state of a control bit is "1", then the switch corresponding to that control bit is turned on. Eq.(2) illustrates that only the switch connected to the capacitor $C_{11}$ is turned on whereas switches $S_{12}$-$S_{1n}$ connected to other capacitors $C_{12}$-$C_{1n}$ are not. Therefore, if the capacitances of capacitors $C_{11}$, $C_{12}$, ..., $C_{1n}$ are C11, C12, ..., C1n respectively, then the capacitance of the capacitor unit 440 equals C11. Then, the input signal Vin corresponding to a desired center frequency is inputted into the power-amplifying unit 460. The output signal Vout is generated through processing of the power amplifier 300. The power-detecting unit 320 detects power of the output signal Vout corresponding to the control signal Si (meaning the switch combination defined by eq.(2)), and the control logic unit 340 counts how many times the control signal Si has been transmitted to judge whether the capacitor unit 440 has been controlled to adopt all wanted switch combinations. If the number of transmitted control signals is less than a threshold value, then the control logic unit 340 adjusts the control signal Si according to different switch combinations to set every control bit of the control signal Si; in other words, previous tested switch combinations will not be repeated. For example:

$$Si=[S11, S12, S13, \ldots, S1n]=[010 \ldots 0] \quad \text{eq. (3)}$$

This means that only the switch $S_{12}$ corresponding to the capacitor $C_{12}$ will be turned on, and other switches $S_{11}$, $S_{13}$-$S_{1n}$ corresponding to other capacitors $C_{11}$, $C_{13}$-$C_{1n}$ will be turned off at this time. The capacitance of the capacitor unit 440 becomes C12 now. Finally, repeating steps described above, the power-detecting unit 320 detects power of the output signal Vout corresponding to the control signal Si (meaning the switch combination defined by eq.(3)). Additionally, the control logic unit 340 records the power of the output signal Vout and the corresponding control signal Si (i.e., the tested switch combination). The above steps are repeated until the number of different control signals Si outputted by the control logic unit 340 is equal to the threshold value, then output of the control signal Si is stopped and a maximum output power and a corresponding control signal Si, according to a plurality of recorded power of the output signal Vout, are chosen. Finally, choosing of the control signal Si is utilized, to set the capacitor unit 440 corresponding to an optimal switch combination. In conclusion, through the process of calibration, because the frequency of the input signal Vin is fixed to a predetermined center frequency Fc, while on/off states of switches $S_{11}$-$S_{1n}$ in the capacitor unit 440 are set via the chosen control signal Si as mentioned above, the center frequency of the power-amplifying module 310 approaches the predetermined center frequency Fc.

Please note that the number of tested switch combinations in this embodiment is adjustable according to design requirements; i.e. all possible switch combinations are tested through selecting different values of control bits S11-S1n. Alternatively, users may only test a few switch combinations instead of all; both methods accomplish the objective of adjusting capacitance of the capacitor unit 440. For example, the number of all capacitors in the capacitor unit is n, and results in the range of $(2^n-1)$ kinds of switch combinations have to be considered if all possible switch combinations are to be tested, therefore the threshold value is set as $2^n-1$. Moreover, the number of capacitors n in this embodiment is not fixed to any particular value, and designers have the elasticity to make suitable corrections according to practical considerations.

Figure 6:
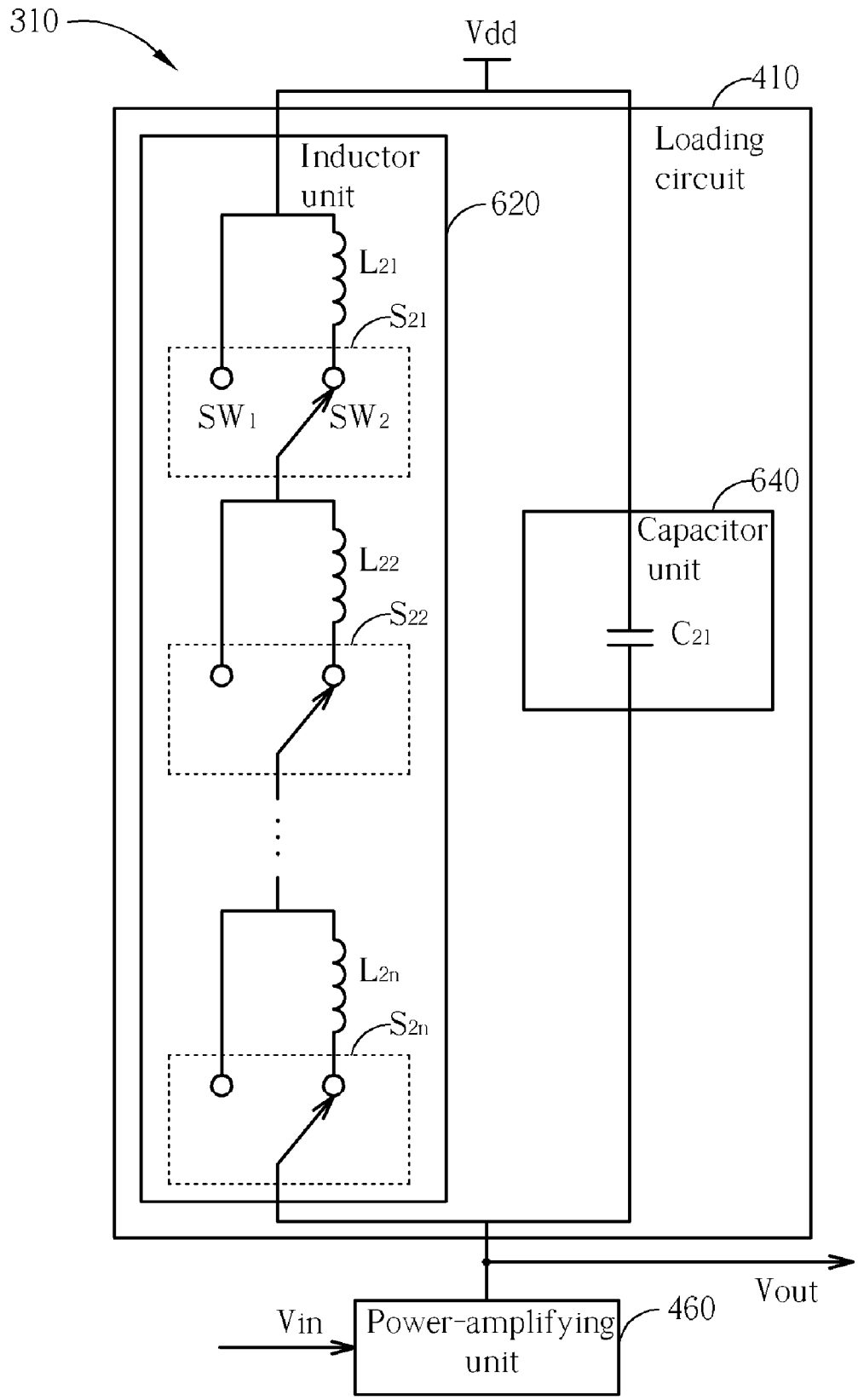
FIG. 6 is a detailed circuit diagram of another embodiment of the power-amplifying module shown in FIG. 3.

In the embodiment, a plurality of capacitors is combined to obtain a plurality of capacitance, and the power amplifier is calibrated through controlling the capacitor unit 440 by the control logic unit 340. However, the objective of calibrating the center frequency of the power amplifier can also be achieved by adjusting inductance. Please refer to FIG. 6. FIG. 6 is a detailed circuit diagram of another embodiment of the power-amplifying module shown in FIG. 3. In this embodiment, the loading circuit 410 in the power-amplifying module 310 has a different circuit structure from that in FIG. 3. The loading circuit 410 comprises an inductor unit 620 and a capacitor unit 640, the inductor unit 620 includes n switches $S_{21}$~$S_{2n}$ corresponding to n inductors $L_{21}$-$L_{2n}$ respectively, and the capacitor unit 440 includes a capacitor $C_{21}$. Switches $S_{21}$-$S_{2n}$ determine inductance of the inductor unit 620 by controlling inductance of corresponding inductors $L_{21}$-$L_{2n}$. Taking the switch $S_{21}$ for example, when the end $SW_1$ in the switch $S_{21}$ is selected, the inductor $L_{21}$ is short and does not influence inductance of the inductor unit 620. When the end $SW_2$ in the switch $S_{21}$ is selected, however, the inductor $L_{21}$ is electrically connected to the inductor unit 620 and influences inductance of the inductor unit 620. In other words, switches $S_{21}$-$S_{2n}$ influence the serial connection among inductors $L_{21}$-$L_{2n}$, and adjust inductance of the inductor unit 620. As described in above eq.(1), the center frequency Fc relates to inductance of the inductor unit 440, therefore, the embodiment adjusts inductance of the inductor unit 620 to set a desired value to the center frequency of the power-amplifying module 310. Due to the operating process of the power-amplifying module 310 in FIG. 6 being similar to the one shown in FIG. 5, the lengthy description is omitted for brevity.

Furthermore, it is possible to integrate both features mentioned above in the power-amplifying module 310. That is, the capacitor unit 440 shown in FIG. 4 and the inductor unit 620 shown in FIG. 6 can be utilized. The inductance of the inductor unit 620 and capacitance of the capacitor unit 440 are controlled through utilizing the control logic unit 420 to control the connection status in the inductor unit 620 and the capacitor unit 440 respectively. The same objective of calibrating the center frequency of the power amplifier is achieved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power amplifier comprising:
   a power-amplifying module for receiving an input signal and amplifying power of the input signal to generate an output signal;
   a control logic unit for generating at least a control signal used to set a center frequency of the power-amplifying module; and
   an output-signal-detecting unit for detecting and recording a plurality of characteristic values of output signals under control signals having a plurality of different values, respectively;
   wherein the characteristic values of the output signals are power values of the output signals.

2. The power amplifier of claim 1 wherein the control logic unit chooses a control signal value corresponding to a maximum of the characteristic values recorded by the output-signal-detecting unit to set the center frequency of the power-amplifying module.

3. The power amplifier of claim 1 wherein the power-amplifying module comprises a capacitor unit, and the control signal controls the capacitance of the capacitor unit to set the center frequency of the power-amplifying module.

4. The power amplifier of claim 3 wherein the capacitor unit comprises:
   a plurality of capacitors; and
   a plurality of switches for switching different connecting topologies applied to the capacitors according to a plurality of control signals.

5. The power amplifier of claim 1 wherein the power-amplifying module comprises an inductor unit, and the control signal controls the inductance of the inductor unit to set the center frequency of the power-amplifying module.

6. The power amplifier of claim 5 wherein the inductor unit comprises:
   a plurality of inductors; and
   a plurality of switches for switching different connecting topologies of the inductors according to a plurality of control signals.

7. A method for calibrating a power amplifier, comprising:
   generating at least a control signal to set a center frequency of the power amplifier;
   detecting a characteristic value of an output signal of the power amplifier;
   recording a plurality of characteristic values of output signals under control signals having a plurality of different values, respectively; and
   choosing a predetermined control signal value according to the characteristic values;
   wherein the characteristic values are power values of the output signals.

8. The method of claim 7 wherein the step of choosing the predetermined control signal value chooses a control signal value corresponding to a maximum of the characteristic values to be the predetermined control signal value.

9. The method of claim 7 wherein the control signal controls capacitance of the power amplifier to set the center frequency of the power amplifier.

10. The method of claim 9 wherein the control signal controls a plurality of switches to determine a connecting topology of a plurality of capacitors.

11. The method of claim 7 wherein the control signal controls inductance of the power amplifier to set the center frequency of the power amplifier.

12. The method of claim 11 wherein the control signal controls a plurality of switches to determine a connecting topology of a plurality of capacitors.

13. A power amplifier comprising:
    a power-amplifying module for receiving an input signal and amplifying power of the input signal to generate an output signal;
    a control logic unit for generating at least a control signal used to set a center frequency of the power-amplifying module; and
    an output-signal-detecting unit for detecting and recording a plurality of characteristic values of output signals under control signals having a plurality of different values, respectively;
    wherein the control logic unit chooses a control signal value corresponding to a maximum of the characteristic values recorded by the output-signal-detecting unit to set the center frequency of the power-amplifying module.

14. The power amplifier of claim 13 wherein the power-amplifying module comprises a capacitor unit, and the control signal controls the capacitance of the capacitor unit to set the center frequency of the power-amplifying module.

15. The power amplifier of claim 14 wherein the capacitor unit comprises:
    a plurality of capacitors; and
    a plurality of switches for switching different connecting topologies applied to the capacitors according to a plurality of control signals.

16. A power amplifier comprising:
    a power-amplifying module for receiving an input signal and amplifying power of the input signal to generate an output signal, wherein the power-amplifying module comprises an inductor unit;

a control logic unit for generating at least a control signal used to control inductance of the inductor unit to set a center frequency of the power-amplifying module; and an output-signal-detecting unit for detecting and recording a plurality of characteristic values of output signals under control signals having a plurality of different values, respectively.

17. The power amplifier of claim 16 wherein the power-amplifying module comprises a capacitor unit, and the control signal controls the capacitance of the capacitor unit to set the center frequency of the power-amplifying module.

18. The power amplifier of claim 17 wherein the capacitor unit comprises:

a plurality of capacitors; and a plurality of switches for switching different connecting topologies applied to the capacitors according to a plurality of control signals.

19. The power amplifier of claim 16 wherein the inductor unit comprises:

a plurality of inductors; and a plurality of switches for switching different connecting topologies of the inductors according to a plurality of control signals.

20. A method for calibrating a power amplifier, comprising:

generating at least a control signal to set a center frequency of the power amplifier;

detecting a characteristic value of an output signal of the power amplifier;

recording a plurality of characteristic values of output signals under control signals having a plurality of different values, respectively; and choosing a predetermined control signal value according to the characteristic values, wherein a control signal value corresponding to a maximum of the characteristic values is chosen as the predetermined control signal value.

21. The method of claim 20 wherein the control signal controls capacitance of the power amplifier to set the center frequency of the power amplifier.

22. The method of claim 21 wherein the control signal controls a plurality of switches to determine a connecting topology of a plurality of capacitors.

23. A method for calibrating a power amplifier, comprising:

generating at least a control signal to control inductance of the power amplifier to set a center frequency of the power amplifier;

detecting a characteristic value of an output signal of the power amplifier;

recording a plurality of characteristic values of output signals under control signals having a plurality of different values, respectively; and choosing a predetermined control signal value according to the characteristic values.

24. The method of claim 23 wherein the control signal controls a plurality of switches to determine a connecting topology of a plurality of capacitors.

25. The method of claim 23 wherein the control signal controls capacitance of the power amplifier to set the center frequency of the power amplifier.

26. The method of claim 25 wherein the control signal controls a plurality of switches to determine a connecting topology of a plurality of capacitors.

* * * * *